United States Patent
Kim et al.

(10) Patent No.: US 10,453,978 B2
(45) Date of Patent: Oct. 22, 2019

(54) SINGLE CRYSTALLINE CZTSSE PHOTOVOLTAIC DEVICE

(71) Applicant: INTERNATIONAL BUSINESS MACHINES CORPORATION, Armonk, NY (US)

(72) Inventors: Jeehwan Kim, Los Angeles, CA (US); Yun Seog Lee, White Plains, NY (US); Talia S. Gershon, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 521 days.

(21) Appl. No.: 14/742,119

(22) Filed: Jun. 17, 2015

(65) Prior Publication Data

US 2016/0268468 A1    Sep. 15, 2016

Related U.S. Application Data

(63) Continuation of application No. 14/656,287, filed on Mar. 12, 2015.

(51) Int. Cl.
*H01L 31/18* (2006.01)
*H01L 31/028* (2006.01)
(Continued)

(52) U.S. Cl.
CPC ........ *H01L 31/028* (2013.01); *H01L 31/0326* (2013.01); *H01L 31/072* (2013.01);
(Continued)

(58) Field of Classification Search
CPC ............. H01L 31/0326; H01L 31/0327; H01L 31/072; H01L 31/0749; H01L 31/1892;
(Continued)

(56) References Cited

U.S. PATENT DOCUMENTS

| | | |
|---|---|---|
| 6,818,530 B2 | 11/2004 | Shimoda et al. |
| 8,236,118 B2 | 8/2012 | Veerasamy |

(Continued)

FOREIGN PATENT DOCUMENTS

| | | |
|---|---|---|
| CN | 1547262 A | 11/2004 |
| CN | 101935880 A | 1/2011 |

(Continued)

OTHER PUBLICATIONS

Engman, Experimental Study of $Cu_2ZnSn(Se, S)_4$ thin films for solar cell applications ,Jun. 2011, Uppsala University, Department of Engineering, pp. 1-55. (Year: 2011).*

(Continued)

*Primary Examiner* — Andrew J Golden
(74) *Attorney, Agent, or Firm* — Tutunjian & Bitetto, P.C.; Erik Johnson (57) ABSTRACT

A method for fabricating a photovoltaic device includes forming a two dimensional material on a first monocrystalline substrate. A single crystal absorber layer including Cu—Zn—Sn—S(Se) (CZTSSe) is grown over the first monocrystalline substrate. The single crystal absorber layer is exfoliated from the two dimensional material. The single crystal absorber layer is transferred to a second substrate, and the single crystal absorber layer is placed on a conductive layer formed on the second substrate. Additional layers are formed on the single crystal absorber layer to complete the photovoltaic device.

13 Claims, 4 Drawing Sheets

(51) Int. Cl.
*H01L 31/032* (2006.01)
*H01L 31/072* (2012.01)

(52) U.S. Cl.
CPC ........ *H01L 31/1892* (2013.01); *Y02E 10/547* (2013.01); *Y02P 70/521* (2015.11)

(58) Field of Classification Search
CPC ........... H01L 31/1896; H01L 21/02568; H01L 21/02557; H01L 21/02378; H01L 31/03923; H01L 31/028; H01L 31/0322; H01L 31/0323
USPC .................................................. 136/243–265
See application file for complete search history.

(56) References Cited

U.S. PATENT DOCUMENTS

| | | | |
|---|---|---|---|
| 8,480,944 | B2 | 7/2013 | Ionkin et al. |
| 8,481,845 | B2 | 7/2013 | Sivaram et al. |
| 8,709,657 | B2 | 4/2014 | Ionkin et al. |
| 9,705,013 | B2 | 7/2017 | Hekmatshoartabari et al. |
| 2007/0277874 | A1 | 12/2007 | Dawson-Elli et al. |
| 2007/0277875 | A1 | 12/2007 | Gadkaree et al. |
| 2009/0235987 | A1 | 9/2009 | Akhtar |
| 2012/0141799 | A1 | 6/2012 | Kub et al. |
| 2012/0199191 | A1* | 8/2012 | Linn ................. H01L 31/03923 136/256 |
| 2012/0295396 | A1 | 11/2012 | Teeter |
| 2013/0056059 | A1 | 3/2013 | Freitag |
| 2013/0074911 | A1 | 3/2013 | Liao |
| 2013/0158698 | A1 | 6/2013 | Jeong et al. |
| 2013/0164882 | A1 | 6/2013 | Afzali-Ardakani et al. |
| 2013/0247994 | A1* | 9/2013 | Hasegawa ........... H01L 31/0326 136/265 |
| 2013/0269764 | A1 | 10/2013 | Barkhouse et al. |
| 2013/0276888 | A1* | 10/2013 | Munteanu ........... H01L 31/0322 136/264 |
| 2013/0344646 | A1 | 12/2013 | Liang |
| 2014/0038344 | A1* | 2/2014 | Bojarczuk ........... H01L 31/0326 438/86 |
| 2014/0048137 | A1 | 2/2014 | Cao et al. |
| 2014/0069323 | A1 | 3/2014 | Wang et al. |
| 2014/0099749 | A1* | 4/2014 | Hong ................ H01L 21/02557 438/95 |
| 2014/0166107 | A1 | 6/2014 | Lee et al. |
| 2014/0179048 | A1 | 6/2014 | Wu et al. |
| 2014/0179053 | A1* | 6/2014 | Wu .................... H01L 31/0326 438/84 |
| 2014/0217356 | A1 | 8/2014 | Bayram et al. |
| 2014/0251435 | A1 | 9/2014 | Ho et al. |
| 2014/0273337 | A1 | 9/2014 | Gresty et al. |
| 2014/0291282 | A1* | 10/2014 | Bedell ................ H01L 21/0272 216/2 |
| 2014/0352751 | A1* | 12/2014 | Wu ..................... H01L 31/0749 136/244 |
| 2015/0000741 | A1 | 1/2015 | Gokmen et al. |
| 2015/0027537 | A1 | 1/2015 | Teraji |
| 2015/0027896 | A1 | 1/2015 | Kim et al. |
| 2015/0083206 | A1 | 3/2015 | Novoselov et al. |
| 2015/0160140 | A1 | 6/2015 | Kang et al. |
| 2016/0204304 | A1 | 7/2016 | Gunawan et al. |
| 2016/0268460 | A1 | 9/2016 | Kim et al. |

FOREIGN PATENT DOCUMENTS

| | | |
|---|---|---|
| CN | 104264211 A | 1/2015 |
| CN | 104264211 A | 1/2015 |
| CN | 103390674 B | 9/2015 |
| EP | 1744365 A2 | 5/2007 |
| JP | 03218620 A | 9/1991 |
| TW | I449193 B | 8/2014 |
| WO | 2012112821 A1 | 8/2012 |
| WO | 2013129275 A2 | 6/2013 |
| WO | 2013129045 A1 | 9/2013 |

OTHER PUBLICATIONS

List of IBM Patents or Patent Applications Treated as Related.
Fleutot, B. et al., "GaSe Formation at the Cu(In,Ga)Se 2 /Mo Interface—A Novel Approach for Flexible Solar Cells by Easy Mechanical Lift-Off," Advanced Materials Interfaces, vol. 1, Issue 4, Jul. 2014. (pp. 1-12).
Kim, J., et al., "Layer-Resolved Graphene Transfer via Engineered Strain Layers," Science, vol. 342, Nov. 2013. (pp. 833-836).
Liu, Z. et al., "Package-Free Flexible Organic Solar Cells with Graphene top Electrodes," Advanced Materials, vol. 25, Issue 31, Aug. 2013. (pp. 1-6).
U.S. Office Action for U.S. Appl. No. 15/401,381 dated Sep. 29, 2017, 32 pages.
U.S. Office Action dated Jun. 1, 2017 issued in U.S. Appl. No. 15/401,381, pp. 1-33.
Office Action Issued in U.S. Appl. No. 15/401,381 dated Dec. 29, 2017, 25 pages.
U.S. Office Action issued in U.S. Appl. No. 15/401,381 dated Sep. 21, 2018, 18 pages.
U.S. Office Action issued in U.S. Appl. No. 15/845,455 dated Apr. 5, 2018, 20 pages.
Chinese Office Action issued in Chinese Application No. 201610139737.0 dated Jan. 26, 2017, 5 pages.
German Office Action issued in German Application No. 102016104502.0 dated Feb. 28, 2018, 8 pages.

\* cited by examiner

SINGLE CRYSTALLINE CZTSSE PHOTOVOLTAIC DEVICE

RELATED APPLICATION DATA

This application is a Continuation application of co-pending U.S. patent application Ser. No. 14/656,287 filed on Mar. 12, 2015, incorporated herein by reference in its entirety.

BACKGROUND

Technical Field

The present invention relates to photovoltaic devices, and more particularly to formation methods and devices using absorber layers comprised of a single crystal chalcogenide compound, such as, Cu—Zn—Sn—S/Se (CZTSSe).

Description of the Related Art

Cu—In—Ga—S/Se (CIGSSe) technology provides high performance solar cells with very high power conversion efficiency (PCE) (e.g., about 20%). CIGSSe solar cells have a very large open circuit voltage (Voc) relative to bandgap with no known issues of interface recombination. Unfortunately the reliance on rare elements, such as indium, for example, limits very large scale deployment of this technology.

Cu—Zn—Sn—S/Se (CZTSSe) is an emerging thin film solar cell technology consisting of all earth abundant elements. While progress has been made in the development of CZTSSe solar cells particularly using hydrazine-based solution processing, a PCE of only about 12.6% has been achieved.

Several major limitations in CZTSSe solar cells exist as well. For example, a low Voc may be experienced, which is suspected to be due to high buffer-absorber interface recombination, high bulk defect states, existence of tail states in the bulk and possible Fermi level pinning in the bulk or at an interface. Furthermore, CZTSSe also suffers from low fill factor (FF) which is mostly due to low Voc and higher series resistance from various layers or potential barrier formation across the device.

SUMMARY

A method for fabricating a photovoltaic device includes forming a two dimensional material on a first monocrystalline substrate; growing a single crystal absorber layer including Cu—Zn—Sn—S(Se) (CZTSSe) over the first monocrystalline substrate; exfoliating the single crystal absorber layer from the two dimensional material; transferring the single crystal absorber layer to a second substrate and placing the single crystal absorber layer on a conductive layer formed on the second substrate; and forming additional layers on the single crystal absorber layer to complete the photovoltaic device.

Another method for fabricating a photovoltaic device includes forming a single sheet layer of graphene on a monocrystalline SiC substrate; growing a single crystal absorber layer including Cu—Zn—Sn—S(Se) (CZTSSe) over the monocrystalline SiC substrate; exfoliating the single crystal absorber layer from the graphene; transferring the single crystal absorber layer to a glass substrate and placing the single crystal absorber layer on a conductive layer formed on the glass substrate; forming a buffer layer on the absorber layer; and forming a transparent conductor over the buffer layer.

A photovoltaic device includes a first contact layer formed on a first substrate. A single crystal absorber layer including Cu—Zn—Sn—S(Se) (CZTSSe) is placed directly on the first contact layer. A buffer layer is formed in contact with the single crystal absorber layer. A transparent conductive contact layer is formed over the buffer layer.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

In accordance with the present principles, a $Cu_2(Zn,Sn)(S,Se)_4$ (CZTSSe) photovoltaic device is provided that includes benefits of earth-abundant constituent elements of the CZTSSe and may provide high performance and higher open circuit voltage. The CZTSSe is grown as a single crystal and transferred to a substrate where it can be employed as an absorber layer in a photovoltaic device, such as, e.g., a solar cell.

Conventional CZTSSe devices are formed on a Mo coated substrate. There is no epitaxial relationship between the CZTSSe and the Mo, such that polycrystalline CZTSSe forms. The polycrystalline CZTSSe includes grain boundaries that can result in recombination centers and shut paths that reduce the performance of the CZTSSe device.

Compared to a baseline CZTSSe device with the same total absorber thickness, single crystal CZTSSe devices may provide higher power conversion efficiency. The single CZTSSe device provides for performance-material cost optimization for large scale deployment of thin film chalcogenide solar cells.

It is to be understood that the present invention will be described in terms of a given illustrative architecture having substrates and photovoltaic stacks; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a photovoltaic device may be created for integrated circuit integration or may be combined with components on a printed circuit board. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of photovoltaic devices and/or integrated circuit chips with photovoltaic devices. The resulting devices/chips can be distributed by the fabricator in raw wafer form (that is, as a single wafer that has multiple unpackaged devices/chips), as a bare die, or in a packaged form. In the latter case the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., Cu—Zn—Sn—S(Se) (CZTSSe). The compounds described herein may include different proportions of the elements within the compound, e.g., $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$, etc. In addition, other elements may be included in the compound, such as, e.g., dopants, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

It is also to be understood that the present invention may be employed in a tandem (multi-junction) structure having multiple layers of single crystal absorber layers transferred to a same substrate or layer. Other architectures, structures, substrate materials and process features and steps may be varied within the scope of the present invention. The tandem structure may include one or more stacked cells.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Figure 1:
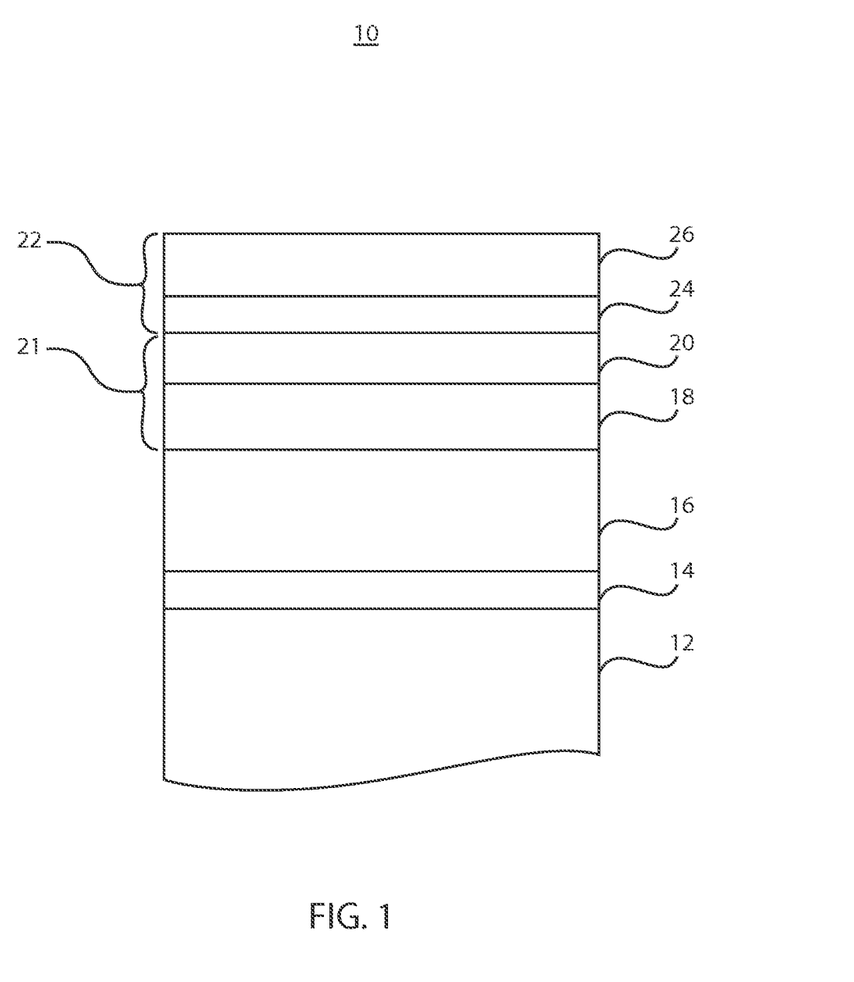
FIG. 1 is a cross-sectional view of a photovoltaic device having a single crystal CZTSSe absorber layer in accordance with the present principles.

Referring now to the drawings in which like numerals represent the same or similar elements and initially to FIG. 1, an illustrative photovoltaic structure 10 is illustratively depicted in accordance with one embodiment. The photovoltaic structure 10 may be employed in solar cells, light sensors, photosensitive devices or other photovoltaic applications. The structure 10 includes a substrate 12. The substrate 12 may include glass or other inexpensive substrates, such as metal, plastic or other material suitable for photovoltaic devices (e.g., quartz, silicon, etc.). A conductive layer 14 is formed on the substrate 12. The conductive layer 14 may include molybdenum although other high work-function materials may be employed (e.g., Pt, Au, etc.). The layer 14 provides a metal contact.

An absorber layer includes a single crystal CZTSSe layer 16. Layer 16 includes a Cu—Zn—Sn containing chalcogenide compound with a kesterite structure of the formula: $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$ (hereinafter CZTSSe). Layer 16 forms the absorber layer, which preferably includes a single crystal (monocrystalline) structure. In a particularly useful embodiment, the Cu—Zn—Sn-containing chalcogenide includes $Cu_2ZnSn(S,$ Se)$_4$. In one embodiment, the CZTSSe film or layer 16 has a thickness of between about 0.2 to 4.0 microns and more preferably about 2 microns. Layer 16 may be grown remotely and transferred for placement on a substrate 12 coated with a conductive material 14 such as Mo.

In one illustrative embodiment, layer 16 includes CZTS (or CZTS with some Se substituted for S) which provides a band gap ($E_g$) from about 1 to 1.5 eV. Although the major elements in CZTS are Cu, Zn, Sn, S, Se, reference to CZTSSe or Cu—Zn—Sn containing chalcogenide material also includes compositions that optionally contain Ge replacing some or all of the Sn and contain Fe replacing some or all of the Zn and that may also contain other dopants, including Sb, Bi, Na, K, Li, Ca, etc.

CZTSSe has many benefits. It is low cost and environmentally harmless, being fabricated using naturally abundant materials. CZTSSe provides good optical properties and has a band-gap energy from approximately 1 to 1.5 eV, depending on the degree of substitution of S with Se, and a large absorption coefficient in the order of $10^4$ cm$^{-1}$. Reducing the reliance on rare indium metal (also heavily consumed by one of the fastest growing industries—thin film displays) opens the possibility of almost limitless material supply.

A buffer layer 21 is formed or grown on layer 16. The buffer layer 21 may include multiple layers, e.g., layers 18, 20. In one embodiment, the buffer layer 21 may include a semiconductor material 18, e.g., from groups IV, III-V, II-VI or I—III-VI$_2$. Semiconductor material 18 may include, e.g., GaAs, Cu—In—Ga—S,Se (CIGSSe), CdTe, CdS, Ge, etc. Semiconductor material 18 and layer 16 may be formed as monocrystalline structures, although semiconductor material 18 may include polycrystalline and even amorphous material.

In one embodiment, CIGSSe is employed for layer 18 and has a chemical formula of CuIn$_x$Ga$_{(1-x)}$Se$_2$ where the value of x can vary from 1 (pure copper indium selenide) to 0 (pure copper gallium selenide). CIGSSe is a tetrahedrally bonded semiconductor, with the chalcopyrite crystal structure, and a bandgap varying continuously with x from about 1.0 eV (for copper indium selenide) to about 1.7 eV (for copper gallium selenide). CIGSSe layer 18 provides high performance as open circuit voltage (Voc) provided using this material is very high relative to bandgap (Eg) (e.g., Eg/q–Voc~0.5 V) and no known issues of interface recombination. In a particularly useful embodiment, layer 18 includes CdS.

The buffer layer 21 may include a second semiconductor material 20. For example, layer 20 may include In$_2$S$_3$ if layer 18 includes CdS. The buffer layer 21 forms a high quality junction with layer 16. The buffer layer 21 may include other materials depending on the material of layer 18. The buffer layer 21 may include, e.g., CdTe, ZnS, Zn(O,S), In$_2$S$_3$, ZnO, etc.

In some embodiments, the layer 21 may include a thickness of between about 0.05 to about 2.0 microns and the CZTSSe layer 16 may include a thickness of between about 0.2 to about 2.0 microns. Although other thicknesses and combinations are contemplated.

A transparent conductive layer 22 is formed over the buffer layer 21. The transparent conductive layer 22 may include a transparent conductive oxide (TCO), such as, e.g., indium tin oxide (ITO), aluminum doped zinc oxide (AZO), boron doped zinc oxide (BZO) or other TCO materials or combinations of these or other materials. The transparent conductive layer 22 may include one or more layers 24, 26. The one or more layers 24, 26 may include different materials, e.g., layer 26 may include ITO while layer 24 may include ZnO. The transparent conductive layer 22 may include a thickness of between about 100 nm to about 1-5 microns. Layer 26 may form a contact for a photovoltaic device 10. Layer 24 may include a buffer layer to adjust the band gap difference between layer 21 and layer 26.

Metal contacts (not shown) may be formed on the transparent conductive layer 22 to further enhance the conductive properties of the transparent conductive layer 22. The metal contacts may include Ni, Al, Mo, Ag, Au, or any other suitable metal or alloy. Since the metal contacts 24 are on the front, light receiving side of the device 10, their size should be optimized to minimize shadowing loss and resistive loss.

In accordance with the present principles, the photovoltaic device 10 is fabricated using a single crystal for layer 16. In particularly useful embodiments, the single crystal is grown and transferred to a final substrate using a transfer process.

Figure 2:
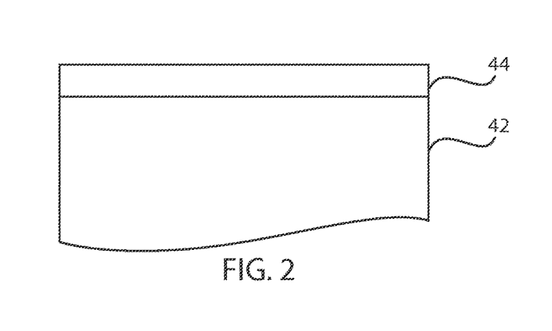
FIG. 2 is a cross-sectional view of a two dimensional material formed on a monocrystalline substrate in accordance with the present principles.

Referring to FIG. 2, a single crystal substrate 42 may include Si, Ge, SiC, GaAs, etc. or alloys thereof. In a particularly useful embodiment, the substrate 42 includes SiC. A two-dimensional material 44 is formed on the substrate 42.

The two-dimensional (2D) material of layer 44 includes strong bonds in two dimensions and weak bonds in a third dimension. A 2D material may include weak Van der Waals forces perpendicular to a layer (weak vertical bonding) such that the material separates easily along atomic layers or strata (e.g., strength in 2D directions). Such 2D materials can be employed as interlayers to facilitate layer transfer of subsequently grown semiconductor films.

While any substrate can be employed as the base substrate 42, the base substrate 42 should be capable of offering seed locations for single crystalline deposition or formation (e.g., single crystalline or single sheet graphene deposition). The 2D material of layer 44 may be deposited (epitaxially grown) on the substrate 42. The layer 44 may include graphene, or other 2D materials, such as, e.g., MoS$_2$ or WS$_2$, boron nitride, mica, dichalcogenides and complex oxides.

In one particularly useful embodiment, the layer 44 includes graphene on a SiC substrate 42. The graphene is employed for and may be formed by a thermal decomposition of a face of a SiC wafer (substrate 42). Si removal from the SiC surface results in the formation of graphene at the surface of SiC. In a SiC substrate 42, below the layer of epitaxial graphene (44) on a SiC face (0001) there is always a carbon rich layer or buffer layer that is iso-structural to graphene with respect to the 2D arrangement of the C atoms. The buffer layer does not possess the sp$^2$ structure of graphene, and thus is not graphene. The buffer layer is also called the 6rt3×6rt3.R30 reconstruction of the SiC surface. It is estimated that about 30-40% of the C atoms in the buffer layer are covalently bonded to underlying Si atoms in the SiC substrate 42. The buffer layer is insulating and does not possess any of the unique properties of graphene. In accordance with the present principles, the covalent bonds can be exploited to enable monolayer (or multiple monolayer) exfoliation of the graphene as will be described.

In one embodiment, graphene is formed as layer 44 by heating a SiC substrate to a temperature greater than 1000 degrees C. resulting in Si evaporation out from the substrate leaving one or more monolayers of single crystalline carbon (graphene). Epitaxial graphene can be grown on semi-insulating 4H- or 6H-(0001) SiC wafer surfaces within an induction-heated graphite susceptor located in an evacuatable chamber (e.g., a stainless steel vacuum chamber or quartz tube furnace) using a multistep process comprising surface preparation steps. For example, these steps may include annealing at 810 degrees C. for 10 min and 1140 degrees C. for 7 min under flow of 20% disilane in He, or annealing at a temperature around 1600 degrees C. in $H_2$ gas. Then, a graphitization step is employed at 1450-1620 degrees C. under Ar flow at a chamber pressure from 3.5 mTorr to 900 mTorr for durations of 5 min to 2 hours. Other process parameters are also contemplated.

Graphene is atomically smooth and when applied to the substrate 42, a small thickness is desired. In one embodiment, the thickness of the graphene layer 44 is preferably one or more monolayers formed as a single crystal or single sheet. In useful embodiments, the number of monolayers of graphene may be determined depending on what is needed to cleanly separate the graphene to produce a split as will be described. The present embodiments will be described in terms of a graphene monolayer structure on a SiC buffer layer; however, other 2D materials may be employed for the layer 44 on other substrate materials.

Figure 3:
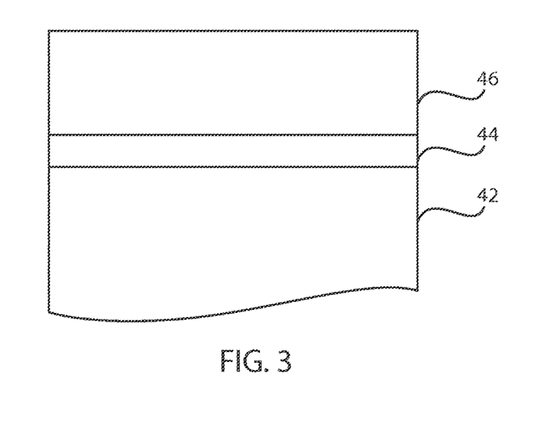
FIG. 3 is a cross-sectional view of the substrate of FIG. 2 having a single crystal CZTSSe absorber layer grown on the two-dimensional material on top of a monocrystalline substrate in accordance with the present principles.

Referring to FIG. 3, a single crystal CZTSSe layer 46 is grown epitaxially on the single sheet layer 44. In one embodiment, the single crystal graphene provides seed sites for the formation of a Kesterite structure CZTSSe direct band gap semiconductor having a (112) single crystal orientation. The thin monolayers of layer 44 stretch or adjust to the underlying substrate to provide a lattice match with the underlying substrate 42 and hence form a single crystal which may be employed to form the single crystal CZTSSe layer 46. The CZTSSe layer 46 can be epitaxially grown on the single crystal layer 44 to form a single crystal structure. The CZTSSe layer 46 can be epitaxially grown by co-evaporation from elemental sources of Cu, Zn, Sn, S, and Se with a substrate temperature in the range of between about 470-500° C. for epitaxial growth. Other processes for epitaxial growth are also contemplated.

Figure 4:
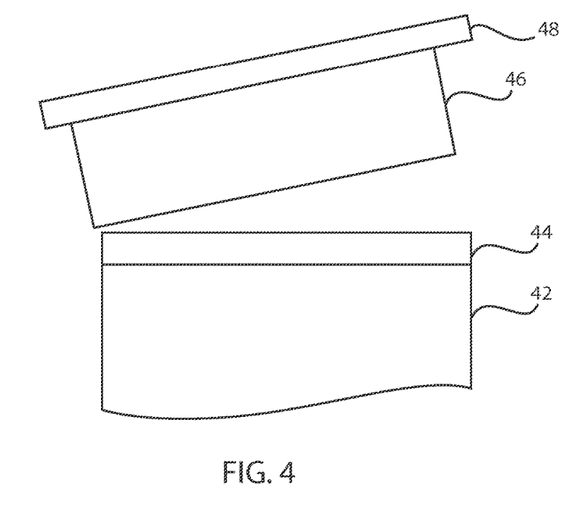
FIG. 4 is a cross-sectional view of the substrate of FIG. 3 having the single crystal CZTSSe absorber layer exfoliated from the underlying substrate in accordance with the present principles.

Referring to FIG. 4, a handle substrate (or tape) 48 may be adhered to layer 46. Handle substrate may include any suitable material to provide leverage for exfoliating the layer 46. The handle or flexible substrate 48 may include a polymeric material(s), such as, e.g., thermoplastics, e.g., polyethylene terephthalate (PET), polyimide, etc.; reinforced epoxy resins, such as e.g., prepreg boards, etc. The flexible substrate 48 may be glued or otherwise adhered by an adhesive or adhering layer to the layer 46. In other embodiments, additional layers may be employed between the flexible substrate 48 and the layer 46.

Next, a cleaving process is employed to remove the single crystal CZTSSe layer 46 from the layer 44 to divide the monolayer or monolayers of layer 44. Depending on the energies and the bonding, the layer 44 may be split to provide zero or more monolayers of the layer 44 on the layer 46 and zero or more monolayers of the layer 44 on the substrate 42. If the layer 44 is covalently bonded to the substrate 42, a portion remains in place on the substrate 42 during the splitting process, although in some embodiments no portion of the spreading layer remains on the substrate 42. The substrate 42 is reusable for other steps or for growing additional layers for other devices.

The cleaving process may include a layer splitting by mechanical force (e.g., spalling, smart-cut, etc.). In this way, layer 46 can be lifted off from substrate 42. Any material from layer 44 may be cleaned from layer 46 after the exfoliation.

Figure 5:
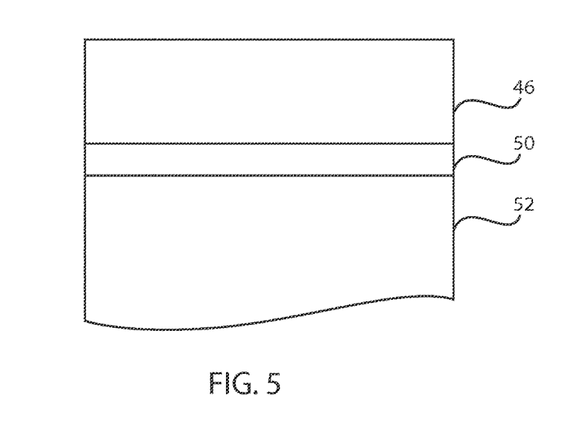
FIG. 5 is a cross-sectional view of the substrate of FIG. 4 having the single crystal CZTSSe absorber layer transferred to a conductive layer on a glass substrate in accordance with the present principles.

Referring to FIG. 5, the layer 46 is placed on a conductive layer 50 on a substrate 52. The substrate 52 may include glass or other material. The conductive layer 50 may include molybdenum although other high work-function materials may be employed (e.g., Pt, Au, etc.). The layer 50 provides a metal contact for a photovoltaic device. The single crystal CZTSSe layer 46 is placed and adhered on the conductive layer 50. In this way, the single crystal CZTSSe layer 46 can be provided for use in the photovoltaic device in direct contact with a contact (50) of the device. This is not achievable by building up the device from a glass substrate, as the CZTSSe would have to be formed on Mo resulting in a polycrystalline, not single crystal, structure.

The handle substrate 48 is removed and processing can continue on the exposed surface of the single crystal CZTSSe layer 46. Processing continues as described with respect to FIG. 1 to provide a photovoltaic device. There are several parameters that can be controlled to optimize the device performance while minimizing the material cost such as bandgap, thickness, etc. The device structures in accordance with the present principles offer high performance and effective thin film solar cells.

Figure 6:
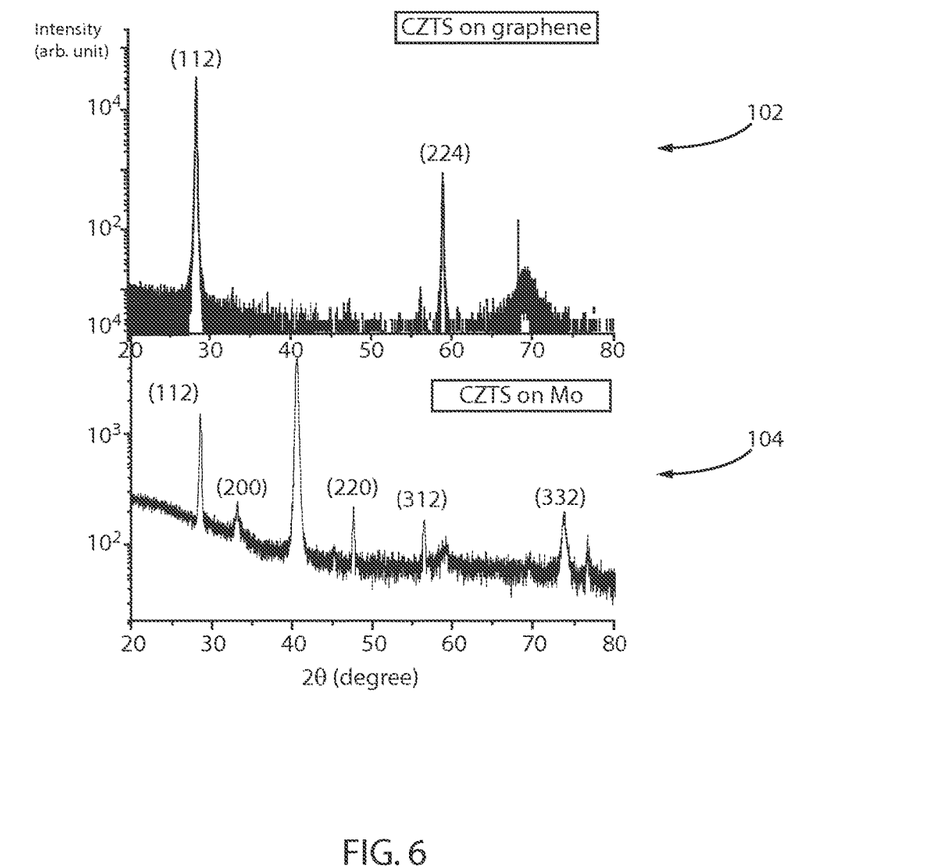
FIG. 6 shows X-ray diffraction data for CZTSSe on two materials, graphene and Mo, with intensity (arbitrary units) plotted versus 2θ, where θ is the angle of diffraction to demonstrate the present principles.

Referring to FIG. 6, X-ray diffraction data is illustratively depicted for CZTSSe on two materials. Intensity (arbitrary units) is plotted versus 2θ, where θ is the angle of diffraction. A first portion 102 shows $Cu_2ZnSnS_4$ on graphene. The $Cu_2ZnSnS_4$ exhibits two well defined peaks (112) and (224) demonstrating a 112 single crystal structure. A second portion 104 shows $Cu_2ZnSnS_4$ on Mo, which represents conventional methodology of forming CZTS on Mo. The $Cu_2ZnSnS_4$ exhibits multiple peaks (112) through (332) indicating polycrystalline structure. As such, there is no epitaxial relation between CZTSSe to Mo so that a single crystal CZTSSe structure cannot be epitaxially grown on Mo (or other metals typically employed in solar cell designs). The polycrystalline structure may suffer from grain boundary issues such as recombination centers, shunt paths, etc.

In accordance with the present principles, the single crystalline CZTSSe layer provides a semiconductor system with a direct band gap of between about 1-1.5 eV. The single crystalline CZTSSe layer, when incorporated into a photovoltaic stack could increase efficiency.

Figure 7:
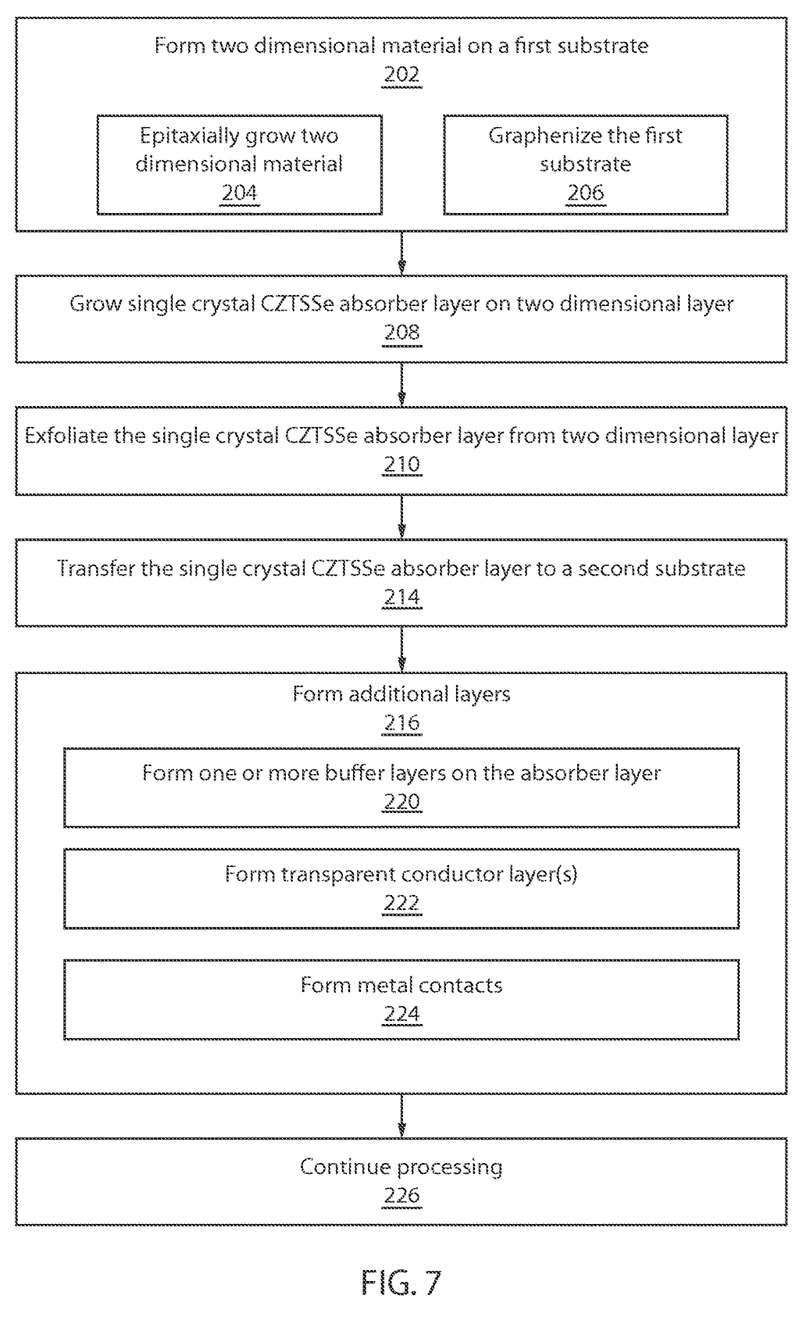
FIG. 7 is a block/flow diagram showing a method for forming a photovoltaic device with a single crystal absorber layer in accordance with illustrative embodiments.

Referring to FIG. 7, methods for fabricating a photovoltaic device are shown in accordance with illustrative embodiments. It should also be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In block 202, a two dimensional material is formed on a first monocrystalline substrate. The two dimensional material preferably includes a single sheet structure. The two dimensional material may be formed by epitaxial growth in block 204 or by employing a graphenization process in block 206. The two dimensional material may include graphene although other materials may be employed. The first monocrystalline substrate may include SiC, and the two dimensional material may be formed by graphenizing the first substrate to form graphene.

In block 208, a single crystal absorber layer including a Cu—Zn—Sn—S(Se) (CZTSSe) layer is grown over the two dimensional material on the monocrystalline substrate. The single crystal absorber layer is preferably epitaxially grown on the single crystal two dimensional material. The CZTSSe may include $Cu_{2-x}Zn_{1+y}Sn(S_{1-z}Se_z)_{4+q}$ wherein $0 \leq x \leq 1$; $0 \leq y \leq 1$; $0 \leq z \leq 1$; $-1 \leq q \leq 1$.

In block 210, the single crystal absorber layer is exfoliated from the two dimensional material. This may include mechanically splitting, spalling, shearing, etc. the single crystal absorber layer from the two dimensional material. The single crystal absorber layer may be cleaned (e.g., etched or processed to remove two dimensional material residue, etc.).

In block 214, the single crystal absorber layer is transferred to a second substrate, and the single crystal absorber layer is placed on a conductive layer formed on the second substrate. The second substrate may include glass or other substrate material including a flexible material (e.g., a polymer). The conductive layer may include Mo or similar material (e.g., high work function metal). A handle substrate may be employed to exfoliate and transfer the absorber layer.

In block 216, additional layers are formed on the single crystal absorber layer to complete the photovoltaic device. Forming additional layers on the single crystal absorber layer may include the following.

In block 220, one or more buffer layers may be formed on the absorber layer. The buffer layer may include a single crystal semiconductor layer, e.g., epitaxially grown on the single crystal absorber layer. The buffer layer may include, e.g., material from groups IV, III-V, II-VI or I-III-VI$_2$, GaAs, Cu—In—Ga—S,Se (CIGSSe), CdTe, CdS, Ge, ZnS, Zn(O, S), In$_2$S$_3$, ZnO, etc.

In block 222, a transparent conductor is formed over the buffer layer. In block 224, metal contacts may be formed on the transparent conductive layer. The metal contacts maybe patterned on the transparent conductor. The metal contacts and the transparent conductor form a front light-receiving surface. The metal contacts are also preferably minimized to provide maximum light absorption. In block 226, processing may continue to complete the device.

Having described preferred embodiments for a single crystalline CZTSSe photovoltaic device (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating a photovoltaic device, comprising:
   forming a two dimensional material on a first monocrystalline substrate;
   growing a single crystal absorber layer including Cu—Zn—Sn—S(Se) (CZTSSe) over the first monocrystalline substrate;
   exfoliating the single crystal absorber layer from the two dimensional material to expose an exfoliated single crystal absorber layer;
   transferring the exfoliated single crystal absorber layer to a second substrate by placing the exfoliated single crystal absorber layer on a conductive layer formed on the second substrate; and
   forming additional layers on the exfoliated single crystal absorber layer to complete the photovoltaic device.

2. The method as recited in claim 1, wherein the first substrate includes SiC and forming a two dimensional material on a first monocrystalline substrate includes graphenizating the first substrate to form the two dimensional material from graphene.

3. The method as recited in claim 1, wherein the two dimensional material includes a single sheet.

4. The method as recited in claim 1, wherein growing a single crystal absorber layer includes epitaxially growing the absorber layer on the two dimensional material.

5. The method as recited in claim 1, wherein exfoliating the single crystal absorber layer includes mechanically splitting the single crystal absorber layer from the two dimensional material.

6. The method as recited in claim 1, wherein forming additional layers on the exfoliated single crystal absorber layer includes:
   forming a buffer layer on the absorber layer; and
   forming a transparent conductor over the buffer layer.

7. The method as recited in claim 6, wherein forming the buffer layer includes forming a single crystal semiconductor layer on the absorber layer.

8. The method as recited in claim 1, wherein the second substrate includes glass and the conductive layer includes Mo.

9. A method for fabricating a photovoltaic device, comprising:
   forming a single sheet layer of graphene on a monocrystalline SiC substrate;
   growing a single crystal absorber layer including Cu—Zn—Sn—S(Se) (CZTSSe) over the monocrystalline SiC substrate;
   exfoliating the single crystal absorber layer from the graphene to expose an exfoliated single crystal absorber layer;
   transferring the exfoliated single crystal absorber layer to a glass substrate by placing the exfoliated single crystal absorber layer on a conductive layer formed on the glass substrate;
   forming a buffer layer on the exfoliated single crystal absorber layer; and
   forming a transparent conductor over the buffer layer.

10. The method as recited in claim 9, wherein forming a single sheet of graphene includes graphenizating the SiC substrate to form graphene.

11. The method as recited in claim 9, wherein growing a single crystal absorber layer includes epitaxially growing the absorber layer on the graphene.

12. The method as recited in claim 9, wherein exfoliating the single crystal absorber layer includes mechanically splitting the single crystal absorber layer from the graphene.

13. The method as recited in claim 9, wherein forming the buffer layer includes forming a single crystal buffer layer on the exfoliated single crystal absorber layer.

* * * * *